United States Patent
Schroeder et al.

(10) Patent No.: US 6,620,724 B1
(45) Date of Patent: Sep. 16, 2003

(54) LOW RESISTIVITY DEEP TRENCH FILL FOR DRAM AND EDRAM APPLICATIONS

(75) Inventors: Uwe Schroeder, Dresden (DE); Helmut Horst Tews, Unterhaching (DE); Irene McStay, Hopewell Junction, NY (US); Manfred Hauf, Munich (DE); Matthias Goldbach, Dresden (DE); Bernhard Sell, Dresden (DE); Harald Seidl, Feldkirchen (DE); Dirk Schumann, Schonfliess (DE); Rajarao Jammy, Wappingers Falls, NY (US); Joseph F. Shepard, Jr., Fishkill, NY (US); Jean-Marc Rousseau, Mennecy (FR)

(73) Assignees: Infineon Technologies AG (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/142,518

(22) Filed: May 9, 2002

(51) Int. Cl.[7] .................. H01L 21/4763; H01L 21/441; H01L 23/48
(52) U.S. Cl. ...................... 438/628; 438/629; 438/643; 438/644; 438/687; 438/763
(58) Field of Search ............................... 438/628, 629, 438/643, 644, 648, 653, 654, 677, 687, 633, 637, 695, 763, 707; 257/751, 762, 750, 758, 622

(56) References Cited

U.S. PATENT DOCUMENTS

| | | | | |
|---|---|---|---|---|
| 5,451,809 A | * | 9/1995 | Shiozawa et al. | |
| 6,017,818 A | * | 1/2000 | Lu | 438/653 |
| 6,025,269 A | * | 2/2000 | Sandhu | 438/688 |
| 6,136,707 A | * | 10/2000 | Cohen | 438/687 |
| 6,139,697 A | * | 10/2000 | Chen et al. | 204/192.15 |
| 6,153,519 A | * | 11/2000 | Jain et al. | 438/681 |
| 6,204,204 B1 | * | 3/2001 | Paranjpe et al. | 438/785 |
| 6,207,222 B1 | * | 3/2001 | Chen et al. | 427/97 |
| 6,245,655 B1 | * | 6/2001 | Moslehi | 438/612 |
| 6,258,689 B1 | * | 7/2001 | Bronner et al. | |
| 6,284,652 B1 | * | 9/2001 | Charneski et al. | 438/653 |
| 6,376,731 B1 | * | 4/2002 | Evans et al. | 585/510 |
| 6,391,785 B1 | * | 5/2002 | Satta et al. | 438/704 |
| 6,403,414 B2 | * | 6/2002 | Marsh | 438/239 |
| 6,475,356 B1 | * | 11/2002 | Ngan et al. | 204/192.17 |
| 6,475,902 B1 | * | 11/2002 | Hausmann et al. | 438/627 |
| 6,482,262 B1 | * | 11/2002 | Elers et al. | 117/84 |
| 6,482,733 B2 | * | 11/2002 | Raaijmakers et al. | 438/633 |
| 6,498,091 B1 | * | 12/2002 | Chen et al. | 438/627 |
| 6,498,112 B1 | * | 12/2002 | Martin et al. | 438/763 |
| 6,511,867 B2 | * | 1/2003 | Lowrey et al. | 438/128 |
| 6,518,668 B2 | * | 2/2003 | Cohen | 257/751 |
| 6,524,867 B2 | * | 2/2003 | Yang et al. | 438/3 |
| 6,528,426 B1 | * | 3/2003 | Olsen et al. | 438/689 |
| 6,537,905 B1 | * | 3/2003 | Chen et al. | 438/629 |
| 6,537,929 B1 | * | 3/2003 | Cheung et al. | 438/790 |

\* cited by examiner

Primary Examiner—Michael S. Lebentritt
(74) Attorney, Agent, or Firm—Lerner, David, Littenberg, Krumholz & Mentlik, LLP

(57) ABSTRACT

Semiconductor devices having deep trenches with fill material therein having low resistivity are provided along with methods of fabricating such semiconductor devices.

38 Claims, 2 Drawing Sheets

LOW RESISTIVITY DEEP TRENCH FILL FOR DRAM AND EDRAM APPLICATIONS

BACKGROUND OF THE INVENTION

Semiconductor devices are employed in many types of equipment to perform a wide variety of applications. An important type of semiconductor device for use in the memory field is known as dynamic random access memory (DRAM). DRAM is extensively used for memory in computers. A basic DRAM cell may include a capacitor and a transistor formed in a semiconductor substrate. The capacitor stores a charge representing data. The transistor allows the data to be refreshed, read from, or written to the capacitor. By reducing the surface area of the capacitor or the transistor, more DRAM cells can fit onto a chip. The increase in the amount of DRAM cells results in greater memory capacity for the chip.

One method of minimizing the surface area of a DRAM cell is to vertically construct the components (i.e., where a semiconductor device includes components formed at several or more layers thereof). One way to accomplish such vertical construction may involve forming a trench in a semiconductor substrate. For example, a dielectric film may be deposited over the sides of the trench. Then, polysilicon may be deposited on the dielectric film, acting as one of the electrodes of the capacitor. A recess may be created in the polysilicon by removing a portion of the polysilicon through an etching process. Layers of conductive, semiconductive and/or insulating material can then be deposited in the recessed area of the polysilicon. The steps of etching the polysilicon and depositing new material can be repeated until the desired component is formed.

As the surface area of a memory cell is made smaller, and higher DRAM density is achieved, the trench area in which capacitors are formed may be reduced. Doped silicon (Si) and other semiconductor materials (i.e., "fill material") are often filled into the trench and become part of the capacitor. For example, a memory cell fabricated as part of a 4 Mbyte DRAM chip may have a trench area of about 11.3 $\mu M^2$. A memory cell fabricated as part of a 256 Mbyte DRAM chip may have a trench area of about 0.6 $\mu m^2$. Similarly, a memory cell fabricated for use in a 1 Gbyte DRAM chip may have a trench area of about 0.32 $\mu m^2$. Thus, the area of the trench typically, but not always, decreases as the memory capacity of the DRAM chip increases.

In order to compensate for the reduced surface area of a DRAM cell, trenches may be formed relatively deep into the substrate, for example between 4–8 $\mu m$ below the substrate surface. This will permit the total area of the trench to remain the same, or even increase, when compared to a shallower but wider trench.

Deeper trenches are typically said to have a high aspect ratio. The "aspect ratio" is the ratio of the depth of a trench compared to the width of the opening at the top of the trench. For example, memory cells fabricated as part of a 256 Mbyte DRAM chip may include trench capacitors having an aspect ratio of between 10:1 and 20:1. This means that the depth of the trench walls is between 10 and 20 times greater than the width of the trench opening. In higher density DRAM chips, such as chips of 1 Gbyte or more, a typical trench aspect ratio may be on the order of 40:1 to 60:1 or higher. In such high aspect ratio situations, the trenches are typically very narrow. The very narrow trenches impact not only the thickness of the fill material of the capacitor, but also how the fill material is formed in the trench.

Capacitance and resistivity are important parameters that affect memory cell operation. For instance, the capacitance of the memory cell may need to remain above a certain level in order for the cell to store charge effectively. In particular, the cell may need to maintain a capacitance on the order of 25 fF. If the capacitance falls significantly below this level, the cell may discharge too rapidly and the data stored by the cell can be lost.

Resistivity needs to be as low as possible in order to effectively charge the capacitor. Preferably, the resistivity is below about 5,000 $\mu\Omega$·cm. In low aspect ratio trenches, fill material layers having about 100 nm thickness could be formed on the dielectric film, commonly known as a node dielectric, which lines the trench sidewalls while maintaining the resistivity of about 5,000 $\mu\Omega$·cm. However, the high aspect ratios of high-density DRAM designs require much thinner fill layers having a lower resistivity level.

Increasing the dopant concentration of the fill material acts to lower resistivity. A method of doping Si is to apply a layer of Si to the node dielectric lining the trench sidewalls, followed by a layer of dopant over of the Si. The dopant can be diffused into the Si by heating, or annealing, the two layers, for instance, in a later step in the process of forming an electrode the DRAM memory cell. One problem with this layering scheme in high aspect ratio trenches is the necessity of forming thin layers of material on the trench sidewalls while maintaining an adequate level of resistivity. Therefore, a need exists for improved capacitor fill material having narrow thickness. A need also exists for improved methods of forming the fill material with a high concentration of uniformly distributed dopant therein.

SUMMARY OF THE INVENTION

The present invention provides a fill material having a resistivity suitable for use in a capacitor. In one embodiment, a semiconductor device includes a semiconductor substrate, a transistor, and a capacitor formed in the substrate. The capacitor is electrically connected to the transistor. The capacitor is formed in a trench defined by sidewalls having a depth and a top opening having a width. A dielectric material lines a portion of the sidewalls. A layer of fill material is arranged on the dielectric material. The fill material includes a semiconductor base material and a dopant, and has a resistivity below 5,000 $\mu\Omega$·cm.

The depth of the sidewalls relative to the width of the top opening defines an aspect ratio of the trench. In one preferred embodiment, the aspect ratio is at least 20:1. More preferably, the depth of the sidewalls is between 4 to 8 $\mu m$ and the aspect ratio is between 40:1 and 60:1.

In another preferred embodiment, the dopant may be selected from the group consisting of As, Sb and P. Similarly, the base material may be selected from the group of Si and SiGe. The dopant concentration is preferably at least $1 \times 10^{17}$.

In accordance with another aspect of the present invention, a method of fabricating a semiconductor device is provided. The method includes forming a trench in a semiconductor substrate. The trench includes sidewalls defining a trench depth and a top opening defining a trench width. The sidewalls may be substantially covered with a dielectric material. A fill material having a resistivity below 5,000 $\mu\Omega$·cm is deposited on the dielectric material. Deposition is preferably performed by flowing a first gas and a second gas together over the trench at a selected temperature and pressure. The first gas includes a base material and the second gas includes a dopant. Flowing the first and second gasses together facilitates in situ doping of the base material.

In one preferred embodiment, the selected temperature is between 400° C. and 700° C. More preferably, the selected temperature is between 500° C. and 600° C. It is also preferable for the selected pressure is between 100 Torr and 1000 Torr.

The method may further comprise applying a relatively low temperature proximate to a top surface of the semiconductor substrate and a relatively high temperature proximate to a bottom surface of the semiconductor substrate. The temperature difference between the top and bottom surfaces may reduce bread loafing and to improve conformality.

In a preferred embodiment, the base material is Si, and the first gas is selected from the group consisting of $SiH_4$, $Si_2H_6$, TCS, DCS and HDS.

In another preferred method, the fill material is formed by depositing a base layer on the dielectric material. The base layer is preferably less than 50 nm thick. Then, the base layer may be soaked with a gas containing a dopant at a second temperature and a second pressure until the base layer is coated with the dopant.

Preferably, the method includes repeating forming the base layer and soaking the base layer between one and five times. In another example, the method includes forming a capping layer over the fill material. The capping layer minimizes out-diffusion of the dopant.

The method preferably includes annealing the semiconductor substrate such that the dopant migrates into the base layer. In yet another example of the invention, the second temperature is between 500° C. and 650° C. and the second pressure is between 50 mTorr and 760 mTorr.

The method of fabricating a semiconductor device may comprise forming the fill material by depositing a base layer on the dielectric material and diffusing a dopant into the base layer at a second temperature and a second pressure. The base layer thickness may be less than 50 nm.

In one example, the first temperature is between 500° C. and 650° C. and the first pressure is between 50 mTorr and 760 mTorr. In another example, the second temperature is between 850° C. and 1100° C., and the second pressure is between 1 Torr and 100 Torr.

In another preferred method of fabricating a semiconductor device, a first fill material is formed over dielectric material in a lower region of a trench, and a second fill material is formed in an upper region of the trench. The first fill material includes a light dopant. The second fill material includes a heavy dopant. The heavy dopant reduces diffusion of the light dopant out of the trench. The combination of the first and second fill materials has a resistivity of below about 5,000 $\mu\Omega$·cm.

In one example, the first fill material is formed by flowing a first base gas and a first dopant gas together over the trench at a first selected temperature and pressure. The first base gas includes a first base material. The first dopant gas includes a light dopant. Flowing the first base gas and first dopant gas together facilitates in situ doping of the first base material. Similarly, the second fill material is formed by flowing a second base gas and a second base material together over the trench at a second selected temperature and pressure. The second base gas includes a second base material. The second dopant gas includes the heavy dopant. Flowing the second base gas and the second dopant gas together facilitates in situ doping of the second base material.

In another example, the first fill material is formed by depositing a first base layer on the dielectric material and soaking the first base layer with a first dopant gas containing the light dopant at a first selected temperature and pressure until the first base layer is coated with the light dopant. The second fill material is formed by depositing a second base layer over the first fill material and soaking the second base layer with a second dopant gas containing the heavy dopant at a second selected temperature and pressure until the second base layer is coated with the heavy dopant.

In another example, the first fill material is formed by depositing a first base layer on the dielectric material and diffusing the light dopant into the first base layer at a first selected temperature and pressure. The second fill material is formed by depositing a second base layer over the first fill material and diffusing the heavy dopant into the second base layer at a second selected temperature and pressure. Preferably, the method further includes forming a capping layer over the second fill material and annealing the semiconductor substrate to diffuse the light and heavy dopants. In an example, the light dopant comprises P and the heavy dopant comprises As. In another example, the light dopant comprises P and the heavy dopant comprises Sb.

The semiconductor device of the present invention and the methods of fabricating a semiconductor device of the present invention provide fill materials that have high dopant concentrations and maintain a desired resistivity. Thin layers of fill material may be used in high aspect ratio trenches, thereby increasing the density of DRAM on a semiconductor chip. The present invention may also be used in stack structures (e.g., structures formed on top of a semiconductor substrate instead of within a trench formed in the semiconductor substrate). For example, a capacitor in a stack structure may be formed having a low resistivity capacitor fill material. The foregoing aspects, features and advantages of the present invention will be further appreciated when considered with reference to the following description of the preferred embodiments and accompanying drawings.

DETAILED DESCRIPTION

In accordance with an embodiment of the present invention, a trench capacitor is formed having a low resistivity capacitor fill material of in situ doped Si. The materials and processes described below can be employed with various kinds of substrates, including, but not limited to Si, gallium arsenide (GaAs), indium phosphide (InP), and silicon carbide (SiC).

Figure 1:
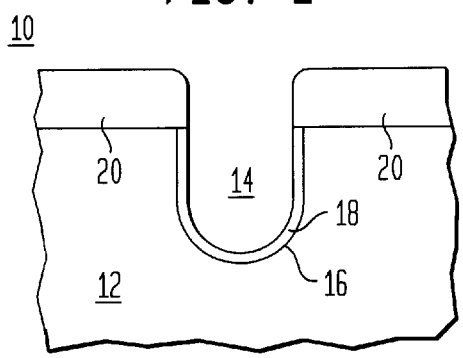
FIG. 1 is a schematic cross-sectional view illustrating a semiconductor substrate having a trench formed therein at a step in the present process of fabricating a semiconductor device.

FIG. 1 is a schematic cross-sectional illustration of a trench 14 formed in a semiconductor substrate 12 in one step of the process of fabricating a capacitor 10. Trench 14 has sidewalls 16 lined with a node dielectric 18. The node dielectric 18 can be, for example, an oxide liner such as silicon dioxide ($SiO_2$). The oxide liner may be formed by known processes, such as chemical vapor deposition (CVD) or thermal oxidation. The node dielectric 18 separates the two plates, or electrodes, of the capacitor. One plate is the substrate 12. The other plate is fill material formed in the interior of the trench over the node dielectric 18. Nitride pads 20 are arranged on either side of the top of the trench 14 for use in further steps in the fabrication process of capacitor 10. After the trench 14 has been formed in semiconductor substrate 12, and the node dielectric 18 has been formed on the sidewalls 16, a fill material is deposited over the node dielectric 18.

Figure 2:
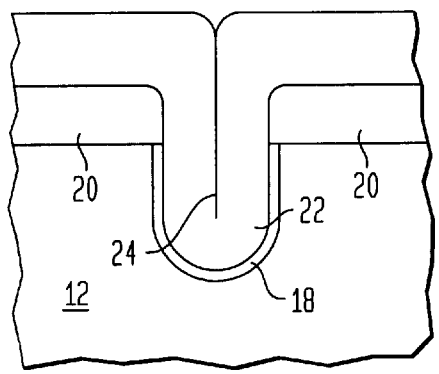
FIG. 2 is a schematic cross-sectional view illustrating the result of another step in a process of forming a semiconductor device of the present invention.

FIG. 2 illustrates another step in the process of fabricating capacitor 10 after an in situ doped fill material 22 has been deposited over node dielectric 18. Fill material 22 substantially fills trench 14, and covers the opening of trench 14 and part of nitride pads 20. A seam 24 may occur during formation of the fill material 22.

In one example of this embodiment, a mixture of silane ($SiH_4$) and arsine ($AsH_3$) gases is simultaneously flowed over the trench 14 at a deposition temperature. This mixture results in the deposit of fill material 22 comprising a base of silicon doped in situ with arsenic (As). Alternatively, other Si-containing gases may be used in place of $SiH_4$. For instance, disilane ($Si_2H_6$), trichlorosilane (TCS), dichlorosilane (DCS) and hexadichlorosilane (HDS) can be employed. A benefit of using $Si_2H_6$, TCS, DCS or HDS is that the bond between Si and other elements in the gas is weaker in these compounds than the bond between Si and $H_4$ in silane. The weaker bond allows the Si to separate more readily from the other elements, which acts to increase uniformity during in situ doping.

In an example, the in situ deposition temperature is between 400° C. and 700° C. This range is not exact, and the temperature may be slightly lower or higher. The deposition temperature is preferably between 500° C. and 600° C. Applying more heat to the bottom of substrate 12 than the top may improve conformality (dopant uniformity) and reduce excess formation of material at the trench opening ("bread loafing"). Further information related to bread loafing may be found in a related application, Ser. No. 10/075, 152 filed on Feb. 14, 2002 by Chakravartl et al., entitled RTCVD PROCESS AND REACTOR FOR IMPROVED CONFORMALITY AND STEP COVERAGE, the entire disclosure of which is incorporated herein by reference.

Flowing of the $SiH_4$ and $AsH_3$ gases may occur at a pressure of between 100 to 1000 Torr. This pressure range, like the temperature range, is not exact and may be slightly lower or higher. This range of pressure increases the uniformity of the As within the Si and may reduce bread loafing. This combination of temperature and pressure can result in a concentration of As within the Si of between $1\times10^{17}$ and $5\times10^{21}$ atoms per $cm^3$.

Other dopants may be used in place of As for in situ doping. For example, antimony (Sb) and phosphorous (P) can be employed. As, Sb and P have different densities, but using Sb or P in place of As may result in dopant concentrations in excess of $5\times10^{21}$ atoms per $cm^3$. The process conditions for P and Sb are similar to the process conditions for As.

In another example of a preferred method, germane ($GeH_4$) gas is added to the $SiH_4$ and $AsH_3$ gasses flowed over the trench 14 during in situ doping. Adding $GeH_4$ to this step in the process of forming capacitor 10 results in a fill material 22 having a base of silicon germanium (SiGe) doped with As. As in the earlier example of the present embodiment, $Si_2H_6$, TCS, DCS or HDS gases can be used in place of $SiH_4$. Also, other dopants such as Sb or P can replace As. Preferably, a layer of amorphous Si is formed on the node dielectric 18 within trench 14 before a first layer of SiGe is formed therein. The layer of amorphous Si acts to improve uniformity. The layer of amorphous Si can be formed using conventional methods, such as CVD. The layer of amorphous Si is preferably less than 4 nm. Note that other forms of Si, including polysilicon, may be used in place of amorphous Si for any embodiment of the present invention.

The deposition temperature of the in situ example of As doped SiGe is between 450° C. and 950° C. The temperature should be held below 950° C. because that is the melting temperature of Ge. Preferably, the deposition temperature is between 500° C. and 600° C. As in the earlier example, the pressure is between 100 and 1000 Torr. Adding Ge to the Si base at this combination of temperature and pressure can increase the dopant concentration within the fill material 22. Specifically, the concentration of As in the SiGe material is between $1\times10^{17}$ and $1\times10^{22}$ atoms per $cm^3$. Sb and P provide similar concentrations.

Figure 3:
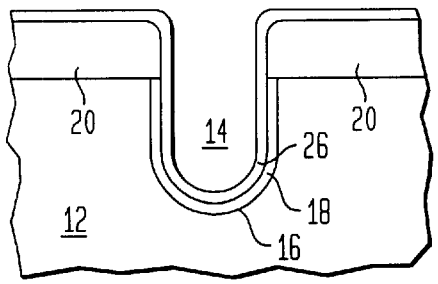
FIG. 3 is a schematic cross-sectional view illustrating a step in another process of forming a semiconductor device of the present invention.

In accordance with another embodiment of the present invention, a trench capacitor is formed having a low resistivity fill material comprising a layer of base material and a layer of dopant. After the trench 14 has been formed in the substrate 12 of FIG. 1 and the node dielectric 18 has been formed over sidewalls 16, a base layer 26 is formed over the node dielectric 18 as illustrated in FIG. 3. In one example, the base layer is Si. Preferably, the Si is amorphous Si formed by deposition. The base layer 26 of amorphous Si is between 5 to 50 nm. The deposition temperature is between about 500° C. to 620° C., preferably between 525° C. and 550° C. The pressure is preferably between 150 and 760 mTorr.

A next step in this example is to "soak" the base layer 26 with a dopant. The dopant could be As, Sb, P, or another material. When using As, soaking involves exposing the base layer 26 to a diluted gas of, for example, $AsH_3$ in hydrogen ($H_2$)

Figure 4:
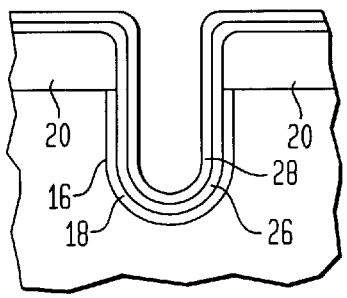
FIG. 4 is a schematic cross-sectional view illustrating the result of yet another step of forming a semiconductor device of the present invention.

FIG. 4 is a cross-sectional schematic illustrating a dopant 28 formed on top of the base layer 26 of Si after the soak. The soak is self-limiting, resulting in the dopant 28 being only a few atomic layers thick. The soak occurs at a temperature between 500° C. and 650° C. and a pressure between 50 and 760 mTorr. Alternatively, the soak process can use other dopants, such as Sb or P. Fill material produced by soaking in this manner has a resistivity less than 5,000 $\mu\Omega\cdot cm$.

Figure 5:
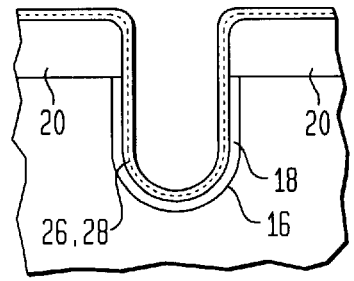
FIG. 5 is a schematic cross-sectional view illustrating a step in another process of forming a semiconductor device of the present invention.

In another example, the dopant 28 (As, Sb or P) is diffused into the base layer 26 of Si instead of employing soaking. FIG. 5 illustrates the fill material after dopant 28 has been diffused into base layer 26. Diffusion is performed at a higher temperature and pressure than soaking, so that the dopant 28 actually penetrates into the base layer 26, which in this case is amorphous Si. For instance, As diffusion preferably occurs by exposing the base layer 26 of Si to a gas of $AsH_3$ at a temperature between 850° C. and 1000° C. and a pressure between 1 Torr and 100 Torr. When employing P as the dopant the temperature and pressure ranges are the same as with As. When employing Sb, the pressure is the same but the temperature range is between 1000° C. and 1100° C.

Fill material produced by diffusion in this manner provides a resistivity less than about 5,000 μΩ·cm. Whether using the soak process or diffusion, the resultant fill material comprising base layer 26 and dopant 28 is less than about 50 nm thick. Preferably, the fill material is on the order of 15 nm. Therefore, although the aspect ratio of the trench 14 can be 60:1 or more, additional layers of fill material can be formed within the trench 14.

Figure 6:
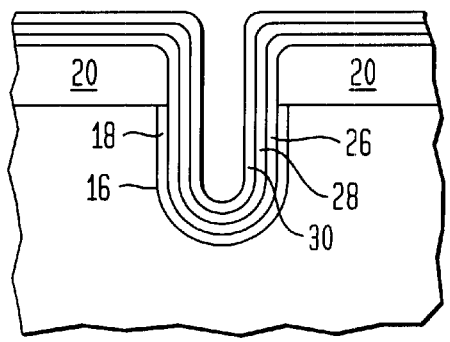
FIG. 6 is a schematic cross-sectional view illustrating the result of an additional step of forming a semiconductor device of the present invention.

FIG. 6 is a schematic cross-sectional illustration after a second base layer 30 has been formed over the first layer of fill material. Additional layers of base layer 30 and dopant 28 can be added from one to five times, or until no more fill material can be added to the trench 14. Preferably, a total of three layers each of the base layer 26, 30 and dopant 28 are formed in the trench 14 (by either the soaking or diffusion processes). As discussed earlier, $Si_2H_6$, TCS, DCS, HDS or other silicon-containing gases may be used in place of $SiH_4$.

In another example of the current embodiment, $GeH_4$ gas is added to the $SiH_4$ and $AsH_3$ gasses flowed over the trench 14. As in previous examples, other Si-containing gases and/or other dopants may be employed. This example can also be explained in relation to FIGS. 3–6. In a step in the process fabricating the capacitor 10 in substrate 12 with a fill material including SiGe, FIG. 3 illustrates a base layer 26 of SiGe deposited over the node dielectric 18. Optionally, a layer of amorphous Si is formed over dielectric 18 before a first base layer 26 of SiGe is formed therein. The amorphous Si can be applied by CVD or other well-known methods. The layer of amorphous Si is preferably less than 4 nm. The base layer of SiGe 26 can be between 5 to 50 nm, preferably about 15 nm. The deposition temperature is between about 450° C. to 950° C., preferably between 500° C. and 600° C. The deposition pressure of SiGe is the same as that used for Si.

Dopant 28, such as As, P or Sb, can be added to the base layer 26 of SiGe either by soaking (FIG. 4) or diffusion (FIG. 5), as in previously examples. FIG. 4 illustrates trench 14 having node dielectric 18 formed along sidewalls 16. A base layer 26 of SiGe is formed over the node dielectric 18. After the base layer 26 of SiGe is formed, the dopant 28 of As, Sb or P may be added as previously described for either soaking or diffusion. As in another embodiment, adding Ge to the Si results in an increased dopant concentration. For instance, the concentration of the dopant 28 of As (or Sb or P) in the SiGe material of either the soaking or diffusion examples is between $1 \times 10^{17}$ and $1 \times 10^{22}$ atoms per $cm^3$.

Additional layers of SiGe may be employed as part of the fill material. FIG. 6 illustrates trench capacitor 10 after a second base layer 30 of SiGe has been formed over dopant layer 28 (which was formed by either soaking or diffusion). Additional layers of base layer 30 and dopant 28 can be added from one to five times, or until the trench 14 is filled. Preferably, a total of three layers each of base layers 26 and 30 (of SiGe) and dopant 28 are formed in the trench 14. As discussed previously, $Si_2H_6$, TCS, DCS, HDS or other silicon-containing gases may be used in place of $SiH_4$ when forming the base layer(s) 26, 30 of SiGe.

Each layer of dopant 28 may be a different material. Preferably, each layer of dopant 28 is the same material. In one example, with a fill material comprising three layers of base layers 26, 30 (of SiGe) and three layers of dopant 28, the first dopant is P, the second dopant is As, and the third dopant is Sb. Alternatively, other combinations of dopants can be employed. Also, base layers 26, 30 can be formed of different materials. A given base layer 26, 30 can be Si or SiGe.

Figure 7A:
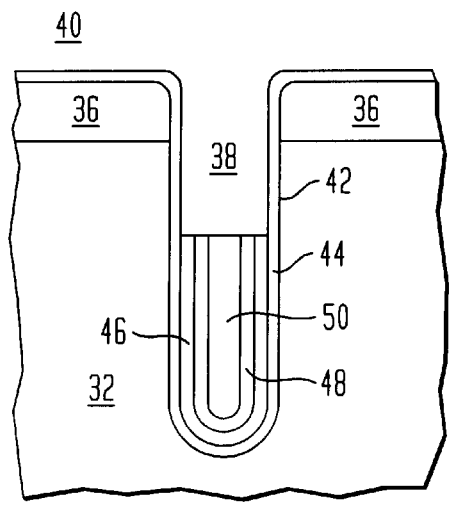
FIGS. 7A–C are schematic cross-sectional views illustrating the result of additional steps of forming a semiconductor device of the present invention.
Figure 7B:
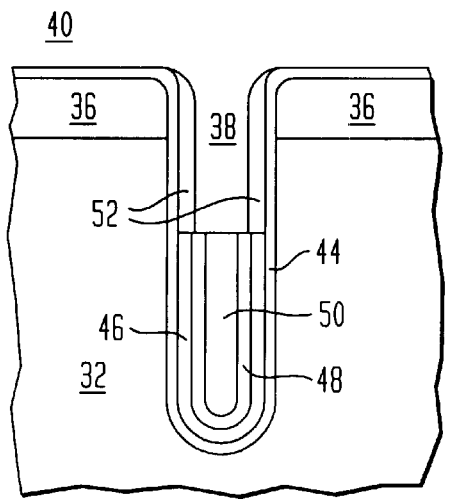
Figure 7C:
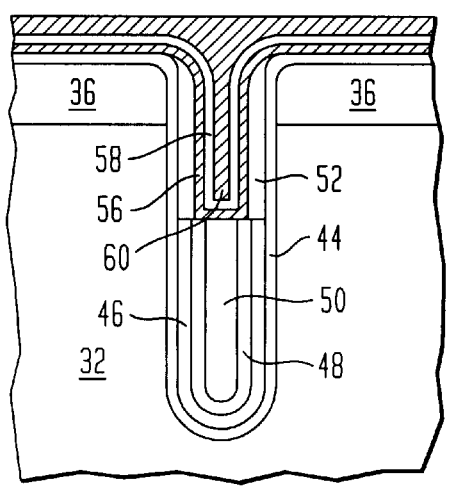

In another embodiment, FIGS. 7A–C are cross-sectional schematics illustrating the formation of a capacitor 40 with a fill material having a combination of light and heavy dopants. In particular, FIG. 7A illustrates a trench 38 formed in a semiconductor substrate 32 in one step of the process of fabricating the capacitor 40. Trench 38 has sidewalls 42 lined with a node dielectric 44. Nitride pads 36 are arranged on either side of the top of the trench 38 for use in further steps in the fabrication of capacitor 34. Base layers 46, 50 and a light dopant 48 may be formed in the trench 38 as described in relation to FIG. 6 (wherein the base layers 46, 50 comprise Si). The light dopant is preferably P. As shown in FIG. 7A, the base layers 46, 50 and light dopant 48 have been recessed within the trench 38. Recessing may be performed by means of a dry etching process such as reactive ion etching (RIE), preferably to a depth between 1 and 2 μm below the surface of semiconductor substrate 32 at this stage in the fabrication process.

FIG. 7B shows a next step wherein a collar 52 is formed on the exposed node dielectric 44 in an upper part of the trench 38. The collar 52 is preferably an oxide. The collar 52 may be formed by depositing $SiO_2$ within the upper part of the trench 38 and then performing an anisotropic etch to remove unwanted $SiO_2$. The collar provides isolation for the capacitor 40 by preventing the formation of vertical parasitic transistors between the capacitor 40 and other regions of the semiconductor substrate 32.

After the collar 52 is formed, the upper part of the trench is filled with additional layers of base material 56, 60 and a heavy dopant 58, as shown in FIG. 7C. The heavy dopant 58 may be, for example, As or Sb. The heavy dopant 58 reduces diffusion of the light dopant 48 out of the trench 38, while the light dopant 48 provides increased conductivity to the fill material.

Optionally, a capping layer (not shown) may be applied over the top of the trench 38 (or over the top of the trench 14 in any of the other embodiments). The capping layer may fill the trench 38 if it is not already full, or it may merely cover the top of the trench 38 if it is full. The capping layer serves two purposes. One purpose is safety. Some of the materials employed in fabricating the capacitor 40, such as As, are toxic. The capping layer prevents exposure to As by people handling the wafer containing the semiconductor substrate 32. The capping layer also acts as a barrier that prevents the dopants 48, 58 from diffusing into additional layers of material that may be formed, for example, on capacitor 40 in further steps in the process of manufacturing a DRAM memory cell. Preferably, the capping layer is undoped amorphous Si or polysilicon formed by conventional methods, such as CVD. After the capping layer is added, the wafer containing the semiconductor substrate 32 may be annealed to further diffuse the dopants 48, 58 into the base layers 46, 50, 56, 60.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of fabricating a semiconductor device comprising:
   (a) forming a trench in a semiconductor substrate, the trench including sidewalls defining a trench depth and a top opening defining a trench width, the sidewalls being substantially covered with a dielectric material; and
   (b) depositing fill material having a resistivity below 5000 $\mu\Omega$·cm on the dielectric material within the trench by flowing a first gas and a second gas together over the trench at a selected temperature and pressure, the first gas including a base material and the second gas including a dopant, wherein flowing the first and second gases together facilitates in situ doping of the base material.

2. The method of claim 1, wherein the trench depth relative to the trench width defines an aspect ratio of at least 20:1.

3. The method of claim 1, wherein the selected temperature is between 400° C. and 700° C.

4. The method of claim 3, wherein the selected temperature is between 500° C. and 600° C.

5. The method of claim 4, wherein the selected pressure is between 100 Torr and 1000 Torr.

6. The method of claim 1. further comprising applying a relatively low temperature proximate to a top surface of the semiconductor substrate and a relatively high temperature proximate to a bottom surface of the semiconductor substrate, whereby the temperature difference between the relatively low and high temperatures acts to reduce bread loafing and improve conformality.

7. The method of claim 1, wherein the dopant is selected from the group consisting of As, Sb and P.

8. The method of claim 1, wherein the base material is selected from the group consisting of Si and SiGe.

9. The method of claim 8, wherein the base material is Si and the first gas containing Si is selected from the group consisting of SiH$_4$, Si$_2$H$_6$, TCS, DCS and HDS.

10. The method of claim 9, wherein the dopant is As, the second gas is AsH$_3$ and flowing the first and second gases forms the fill material of Si with As having a dopant concentration of between 1×10$^{17}$ and 5×10$^{21}$ atoms/cm$^3$.

11. The method of claim 8, wherein the base material is SiGe, the dopant is As and the second gas is AsH$_3$, and flowing the first and second gases forms the fill material of SiGe doped with As having a dopant concentration of between 1×10$^{17}$ and 1×10$^{22}$ atoms/cm$^3$.

12. The method of claim 11, wherein the first gas includes GeH$_4$.

13. A method of fabricating a semiconductor device comprising:
   (a) forming a trench in a semiconductor substrate, the trench including sidewalls defining a trench depth and a top opening defining a trench width, the sidewalls being substantially covered by a dielectric material;
   (b) forming a layer of fill material having a resistivity below about 5000 $\mu\Omega$·cm on the dielectric material at a first temperature and a first pressure, the fill material being formed by depositing a base layer having a thickness less than 50 nm on the dielectric material; and
   (c) soaking the base layer with a gas containing a dopant at a second temperature and a second pressure until the base layer is coated with the dopant.

14. The method of claim 13, wherein the trench depth relative to the trench width defines an aspect ratio of at least 20:1.

15. The method of claim 13, wherein the dopant is selected from the group consisting of As, Sb and P.

16. The method of claim 13, wherein the base layer is selected from the group consisting of amorphous Si and SiGe.

17. The method of claim 16, wherein the base layer is SiGe and the method includes forming a first layer of amorphous Si on the dielectric material before the SiGe is formed.

18. The method of claim 13, further including repeating forming the base layer and soaking the base layer between one and five times.

19. The method of claim 13, further comprising forming a capping layer over the fill material, whereby the capping layer minimizes outdiffusion of the dopant.

20. The method of claim 19, wherein the capping layer is Si.

21. The method of claim 13, further including annealing the semiconductor substrate such that the dopant migrates into the base layer.

22. The method of claim 13, wherein the second temperature is between 500° C. and 650° C. and the second pressure is between 50 mTorr and 760 mTorr.

23. A method of fabricating a semiconductor device comprising:
   (a) forming a trench in a semiconductor substrate, the trench including sidewalls defining a trench depth and a top opening defining a trench width, the sidewalls being substantially covered by a dielectric material;
   (b) forming a layer of fill material having a resistivity of below about 5000 $\mu\Omega$·cm on the dielectric material at a first temperature and a first pressure, the fill material being formed by depositing a base layer having a thickness less than 50 nm; and
   (c) diffusing a dopant into the base layer at a second temperature and a second pressure.

24. The method of claim 23, wherein the dopant is selected from the group consisting of As, Sb and P.

25. The method of claim 23, wherein the base layer is selected from the group consisting of Si and SiGe.

26. The method of claim 25, wherein the base layer is SiGe and the method includes forming a first layer of amorphous Si on the dielectric material before the SiGe is formed.

27. The method of claim 23, wherein the second temperature is between 850° C. and 1100° C. and the second pressure is between 1 Torr and 100 Torr.

28. The method of claim 23, wherein the first temperature is between 500° C. and 650° C. and the first pressure is between 50 mTorr and 760 mTorr.

29. The method of claim 28, wherein the first temperature is between 525° C. and 550° C. and the base layer is 15 nm thick.

30. The method of claim 23, further including repeating the steps of forming and soaking the base layer between one and five times.

31. The method of claim 23, further comprising forming a capping layer over the fill material, whereby the capping layer minimizes outdiffusion of the dopant.

32. A method of fabricating a semiconductor device comprising:
   (a) forming a trench in a semiconductor substrate, the trench including sidewalls defining a trench depth and a top opening defining a trench width, the sidewalls being substantially covered by a dielectric material;
   (b) forming a first fill material including a light dopant over the dielectric material in a lower region of the trench;

(c) forming a second fill material including a heavy dopant in an upper region of the trench, wherein the second fill material reduces diffusion of the light dopant out of the trench, and the combination of the first and second fill materials has a resistivity of below about 5000 $\mu\Omega\cdot$cm.

33. The method according to claim 32, wherein:

forming the first fill material includes flowing a first base gas and a first dopant gas together over the trench at a first selected temperature and pressure, the first base gas including a first base material and the first dopant gas including the light dopant, wherein flowing the first base gas and the first dopant gas together facilitates in situ doping of the first base material; and forming the second fill material includes flowing a second base gas and a second dopant gas together over the trench at a second selected temperature and pressure, the second base gas including a second base material and the second dopant gas including the heavy dopant, wherein flowing the second base gas and the second dopant gas together facilitates in situ doping of the second base material.

34. The method according to claim 32, wherein:

forming the first fill material includes depositing a first base layer on the dielectric material and soaking the first base layer with a first dopant gas containing the light dopant at a first selected temperature and pressure until the first base layer is coated with the light dopant; and forming the second fill material includes depositing a second base layer over the first fill material and soaking the second base layer with a second dopant gas containing the heavy dopant at a second selected temperature and pressure until the second base layer is coated with the heavy dopant.

35. The method according to claim 32, wherein:

forming the first fill material includes depositing a first base layer on the dielectric material and diffusing the light dopant into the first base layer at a first selected temperature and pressure; and forming the second fill material includes depositing a second base layer over the first fill material and diffusing the heaving dopant into the second base layer at a second selected temperature and pressure.

36. The method according to claim 32, further including:

forming a capping layer over the second fill material; and annealing the semiconductor substrate to diffuse the light and heavy dopants.

37. The method according to claim 32, wherein the light dopant comprises P and the heavy dopant comprises As.

38. The method according to claim 32, wherein the light dopant comprises P and the heavy dopant comprises Sb.

* * * * *